United States Patent
Travaglia et al.

[11] Patent Number: 5,805,649
[45] Date of Patent: Sep. 8, 1998

[54] PHASE-LOCK LOOP CIRCUIT WITH FUZZY CONTROL

[75] Inventors: Federico Travaglia, Milan; Maria Grazia La Rosa, Catanta; Guido Giarrizzo, Catania, all of Italy

[73] Assignees: SGS-Thomsom Microelectronics S.r.l., Agrate Brianza; Consorzio per la Ricerca sulla Microelettronica nel Mezzogiorno, Catania, both of Italy

[21] Appl. No.: 497,455

[22] Filed: Jun. 30, 1995

[30] Foreign Application Priority Data

Jul. 1, 1994 [EP] European Pat. Off. .............. 94830326

[51] Int. Cl.$^6$ ....................................................... H03D 3/24
[52] U.S. Cl. ........................... 375/376; 364/274.6; 395/3; 327/147
[58] Field of Search ..................................... 375/377, 371, 375/373, 374, 375, 376; 364/274.6; 395/3, 61, 900; 327/2, 141, 147, 149, 150, 156, 158, 159; 331/172, DIG. 2, 1 R, 4

[56] References Cited

FOREIGN PATENT DOCUMENTS

| A-0 115 234 | 8/1984 | European Pat. Off. | ......... H04N 9/46 |
| A-40 31 939 | 5/1992 | Germany | ......................... H03L 7/10 |

OTHER PUBLICATIONS

Simon et al., "Real–time navigation using the global positioning system", IEEE Aerospace and Electronic System Magazine, Jan. 1995.

European Search Report from European Patent Application No. 94830326.8, filed Jul. 1, 1995.

Electronics & Communications In Japan, Part I —Communications, vol. 76, No. 9, 1993, New York, US pp. 44–54, Yoshiaki Tarusawa et al. "Digital Loop–Preset Synthesizer (DLPS) For High–Speed Frequency Switching".

1992 IEEE International Symposium On Circuits and Systems, vol. 6 of 6, May 10, 1992, San Diego pp. 2661–2664, C. Fiocchi et al. "A Sigma–Delta Based PLL For Non–Sinusoidal Waveform".

IEEE 1994 Position Location And Navigation Symposium, Apr. 11, 1994, Las Vegas, US, pp. 252–259 D. Simon et al. "Fuzzy Phase–Locked Loops".

*Primary Examiner*—Stephen Chin
*Assistant Examiner*—Bryan Webster
*Attorney, Agent, or Firm*—Wolf, Greenfield & Sacks, P.C.; James H. Morris

[57] ABSTRACT

A phase-lock loop circuit with fuzzy control, includes a phase comparator whose output is connected to a low-pass filter that drives a voltage-controlled oscillator. The phase comparator generates a signal that represents the phase difference between an input signal and a signal generated by the oscillator. The oscillator of the present invention is furthermore driven by a control signal generated by fuzzy control. The input of the fuzzy control is the signal that represents the phase difference.

35 Claims, 4 Drawing Sheets

PHASE-LOCK LOOP CIRCUIT WITH FUZZY CONTROL

BACKGROUND OF THE INVENTION

1. Field of the Invention

The present invention relates to a phase-lock loop circuit (PLL) with fuzzy control.

2. Discussion of the Related Art

As is known, the Phase Lock Loop (PLL) is the electronic system that allows to match and follow the phase 5 of an input signal with the phase of a locally generated signal.

Simple circuits are normally used to provide this function, such as a phase comparator, a voltage-controlled oscillator (VCO), and a low-pass filter connected in a particular negative-feedback configuration that adapts to phase variations of the input signal and thus to its frequency variations.

The structure of a conventional PLL is shown in FIG. 8. The conventional PLL is essentially composed of a phase comparator 2, a voltage-controlled oscillator 4, and a low-pass filter 3.

The purpose of the phase comparator 2 is to provide information on the phase difference between the input signal x and the output signal y generated inside the PLL by the voltage-controlled oscillator 4.

A typical example of transfer curve of the phase comparator 2 is shown in FIG. 9. A first fundamental characteristic of the phase comparator 2 is the periodic nature of the criterion h that relates the inputs of the phase comparator and the output, i.e.:

$$z = h(\Delta\phi)$$

where z is the output signal of the comparator 2 and $\Delta\phi$ is the phase difference between the two input signals x and y.

A second fundamental characteristic of the phase comparator is the nonlinearity of h within each period.

The voltage-controlled oscillator 4 performs the role of generating the output signal y(t) which is provided to the input of the phase comparator 2. The frequency of the oscillator 4 is driven by a single input voltage. It should be noted that the relationship between the value of the input voltage that originates from the filter 3 and the output frequency of the oscillator 4 may be nonlinear.

The low-pass filter 3 has the fundamental purpose of closing the feedback loop and of permanently setting the static and dynamic characteristics of the PLL. Operation of the PLL is in fact mainly dependent upon the order and type of the filter used.

A simplified layout of the conventional lock circuit, designated by the reference numeral 1, is shown in FIG. 7. A typical input waveform to the PLL 1 is given by the function:

$$x(t) = g_T(w_f t + \phi_g),$$

and a typical output waveform is given by the function:

$$y(t) = f_T(w_f t + \phi_f).$$

The purpose of the conventional PLL circuit is to equalize the phase and/or frequency of the two signals.

Different situations can arise according to the initial frequency difference of the two signals.

If $|w_f - w_g| > \Delta w_L$, where $\Delta w_L$ is the locking range of the PLL, the circuit will tend to lock gradually, exhibiting cycle skipping. This condition generally has the drawback of being excessively long. If the loop does not converge, the condition becomes infinitely long. This situation must therefore be absolutely avoided in normal operating conditions.

If, however, $|w_f - W_g| < \Delta w_L$, then the output signal of the PLL circuit correctly follows the phase and/or frequency variations in the input signal. This is the optimum operating condition.

A particular factor of such phase-lock circuits is their lock-in range, i.e. the frequency range within which the PLL correctly operates to follow any phase and/or frequency variation of the input signal. It is usually desirable that this range be the widest possible.

From this point of view the need to keep this range as wide as possible is evident. The goal of making the lock-in range as wide as possible can entail problems for other important factors of the PLL. A particularly critical problem is the behavior of the phase-locked loop with respect to noise.

An object of the present invention is to provide a phase-lock circuit with fuzzy control that considerably extends its lock-in range compared with known phase-locked loop circuits.

Another object of the present invention is to provide a circuit that allows a control that is independent of the type of phase comparator used.

Another object of the present invention is to provide a circuit that can reduce locking times with respect to known circuits.

Another object of the present invention is to provide a circuit that is highly reliable, relatively easy to manufacture, and low cost.

SUMMARY OF THE INVENTION

These and other objects and advantages are achieved by providing a phase-lock circuit with fuzzy logic control, which includes a phase comparator whose output is connected to a low-pass filter, said low-pass filter being suitable to drive a voltage-controlled oscillator. The phase comparator is suitable to generate a signal that represents the phase difference between an input signal and a signal generated by the oscillator. The oscillator is furthermore driven by fuzzy logic control which receives the signal representing the phase difference.

BRIEF DESCRIPTION OF THE DRAWINGS

Further characteristics and advantages of the invention will become apparent from the description of a preferred but not exclusive embodiment, illustrated only by way of non-limitative example in the accompanying drawings, wherein.

DETAILED DESCRIPTION

Figure 1:
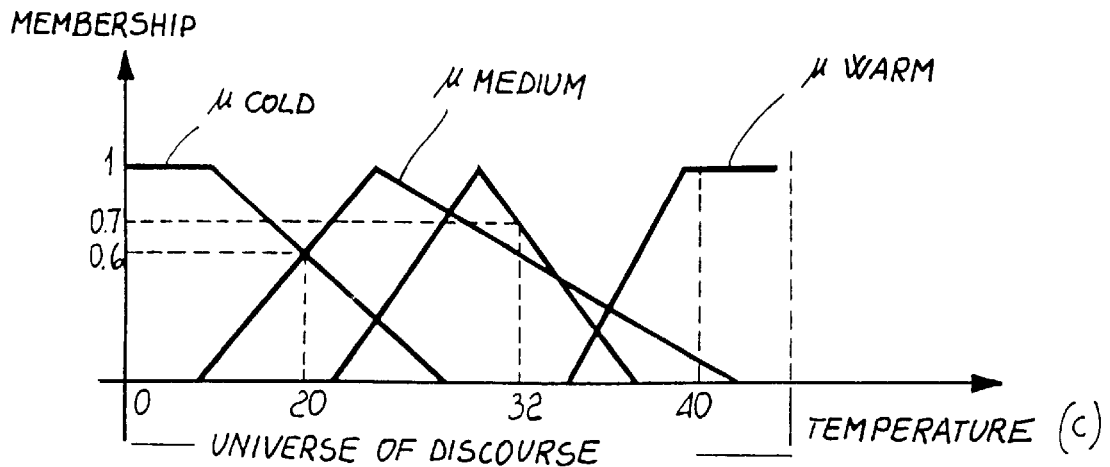
FIG. 1 is an example of a fuzzy set and of degrees of membership functions.

In order to better explain the inventive concept of the present invention, some introductory principles of fuzzy-logic control, as used in the circuit and the process according to the present invention, are described below.

Fuzzy logic, as compared with classical logic, attempts to model reasoning processes that are typical of the human mind, allowing machines to make rational decisions in uncertain and inaccurate environments.

Fuzzy logic provides a set of rules for handling non-exact facts. These rules are expressed by means of the semantics of a linguistic method.

The basic concepts of fuzzy logic are linguistic variables and fuzzy sets, the latter being characterized by membership functions.

Fuzzy logic operates using linguistic descriptions of reality. This means that a problem is not characterized exactly (as with a mathematical model) but rather is provided as a linguistic representation of the algorithms. A particular class of variables, known as linguistic variables, is used to represent information that becomes available during the linguistic description step. Linguistic variables are characterized based on the type of values that can be assigned to them. The type of value can include words or sentences in any natural or artificial language.

Accordingly, linguistic variables contain the semantic meaning of the sentences used in modeling the problem. Syntactically speaking, a set of values that depends on the selected variable can be found for each linguistic variable. This set can assume different meanings according to the context in which it is used.

For each linguistic variable it is possible to provide a table that summarizes all the values that the linguistic variable can assume. These values can generally be obtained by applying appropriate modifiers to a primary term, which represents the variable, or to its opposite. The following table gives an idea of this.

| Linguistic variable | name: TEMPERATURE |
| --- | --- |
| Primary term | COLD |
| opposite | WARM |
| Modifiers | NOT, VERY, MORE, or LESS |

Fuzzy sets and the associated membership functions are closely linked to the above-mentioned linguistic variables. Each value assigned to a linguistic variable is in fact represented by a fuzzy set.

A fuzzy set can be considered as a distribution of possibilities that links a particular value of a linguistic variable to a definition domain (the universe of discourse). If a fuzzy set is plotted on a chart, the degrees of membership (or truths) are plotted on the ordinate, whereas the universe of discourse, i.e., the definition domain of the fuzzy variable (in this case, the temperature and the related fuzzy set), is plotted on the abscissa.

This domain can be a continuous space $\{x\}$ or a discrete representation $\{x1 \ldots x2\}$. For example, if X is a temperature, $\{x\}$ represents its range of variability, whereas $\{x1 \ldots x2\}$ represents the discrete values that characterize it.

A membership function $\mu(x)$ is a function that identifies a fuzzy set in the universe of discourse that is characteristic of a linguistic variable, and that associates a degree of membership of a given value to the fuzzy set for each point of the definition domain (universe of discourse), accordingly mapping the universe of discourse in the interval [0,1].

A membership value $\mu(x)=0$ indicates that point x is not a member of the fuzzy set being considered, which is identified by the function $\mu$, whereas a membership value $\mu(x)=1$ indicates that the value x is certainly a member of the fuzzy set.

Membership functions are entities on which fuzzy calculus is performed. This calculus is performed by means of appropriate operations on the sets represented by the membership functions.

Figure 2:
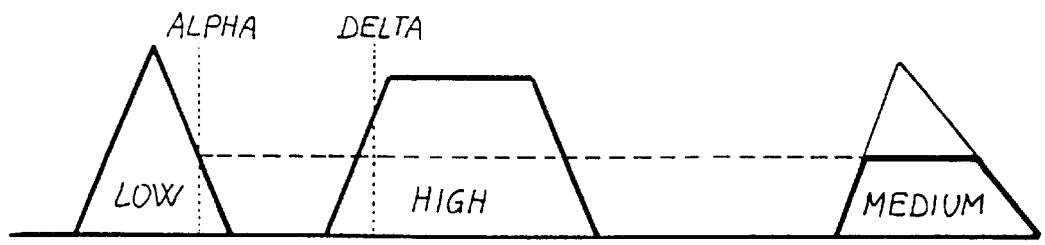
FIG. 2 is an example of a MAX/MIN fuzzy inference.

The collection of all the fuzzy sets of a linguistic variable is known as a "term set". FIG. 2 summarizes the definitions given earlier. FIG. 2, for the sake of graphic simplicity, plots triangular membership functions $\mu_{cold}$, $\mu_{medium}$ and $\mu_{warm}$ which can generally be represented by any linear or non-linear function.

The adoption of a particular computational model is one of the factors that affect the performance of the device. However, the fuzzy control process for phase-lock circuits according to the present invention can be implemented with any fuzzy computational model. Examples of these computational models will be described hereinafter.

At the high level, a fuzzy program is a set of rules of the IF-THEN type. The following example shows a set of three rules with two inputs (A and B) and two outputs (C and D). The various terms A1, A2 ... D3 represent the knowledge of the system, obtained from expert technicians or in other ways, in the form of membership functions:

rule 1: IF [(A is A1)] AND (B is B1)] THEN [(C1 is $C_1$) AND (D1 is $D_1$)]

rule 2: IF [(A is A2)] AND (B is B2)] THEN [(C2 is $C_2$) AND (D2 is $D_2$)]

rule 3: IF [(A is A3)] AND (B is B3)] THEN [(C3 is $C_3$) AND (D3 is $D_3$)]

The part of each rule that precedes THEN is commonly termed the "left part" or "antecedent", whereas the part that follows THEN is termed "consequent" or "right part".

The inputs A and B, after being appropriately fuzzified, i.e., converted into membership functions, are sent to the rules to be compared with the premises stored in the memory of the control device (the IF parts). Multiple rules are combined simply by means of a fuzzy union operation on the membership functions that are the result of each rule.

Conceptually, the better the equalization of the inputs with the membership function of a stored rule, the higher the influence of said rule in overall computation.

In order to determine this equalization, weight functions which identify some particularly indicative values are determined. One of these weight functions is the function $\alpha$, which indicates the extent to which the input propositions (A1, B1) match the stored premises (A, B). In the above example of rules, the function $\alpha$ is given as:

$$\alpha_i A = \max(\min(A1, A_i))$$

$$\alpha_i B = \max(\min(B1, B_i))$$

for i=1, 2, 3 (number of rules).

The second weight function is $\Omega_i$, which indicates the extent of the "general resemblance" of the IF part of a rule. For the above example, the function $\Omega_i$ is calculated as:

$$\Omega_i = \min(\alpha_i A, \alpha_i B, \ldots)$$

for i equal to the number of rules and with as many items inside the parentheses as there are propositions (the IF part) of each rule. As an alternative to the above membership function, a weight function equal to the product of the individual membership values is usually used:

$$\Omega_{i=\alpha_i A \times \alpha_i B}$$

These values, which in practice define the activation value of the antecedent of the fuzzy inference, are used subsequently to calculate the activation value of the consequent (i.e., the right part).

As far as this subject is concerned, two different inference methods are generally considered: MAX/DOT and MAX/MIN. Essentially, both methods act by modifying the membership functions of the consequent by means of a threshold value supplied by the antecedent.

The MAX/MIN method acts by clipping the membership functions related to the consequent in the manner shown in FIG. 2. The rule of the fuzzy inference of FIG. 2 is as follows:

IF alpha IS low AND delta IS high THEN gamma IS medium

As regards the values "alpha" and "delta" in input, one uses the related lower (threshold) membership value with which the membership function of the output "gamma" is clipped. In practice, the membership function in output will have no value higher than the threshold value.

Figure 3:
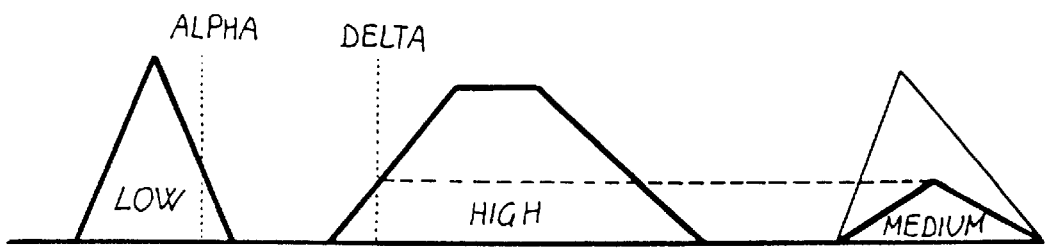
FIG. 3 is an example of a MAX/DOT fuzzy inference.

The MAX/DOT method instead acts by modifying the membership functions of the right part (the consequent), so that the membership function of the output is "compressed", while trying to maintain its original shape as much as possible. The MAX/DOT method for the same rule as above is shown in FIG. 3.

In the case of fuzzy control, it is possible to simplify the calculation of the weights α. It is in fact possible to considerably reduce the amount of calculation by assuming that one is dealing with a degenerate case of fuzzy calculus in which the input variables are not fuzzy sets (ambiguous values) but are variables which generally originate from sensors and are thus definite numeric values. The input data are not fuzzy sets but crisp values.

Figure 4:
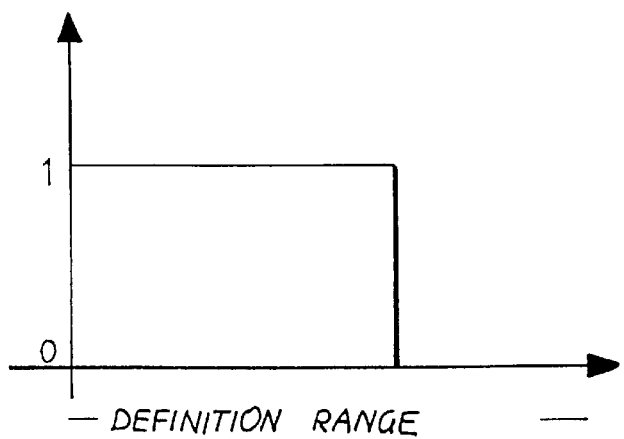
FIG. 4 is an example of a crisp-type membership function.

In order to represent these values within a fuzzy system, they must be converted into crisp membership functions, i.e., into particular membership functions which have an activation value of 1 ("TRUE") at the point which corresponds to the value provided in input. Equally, these crisp values have a zero ("FALSE") value in the remaining part of the definition range. This concept is shown in FIG. 4.

In order to convert a physical value, provided for example by an external sensor, into a fuzzy value, it is thus sufficient to assign the maximum truth value that is characteristic of the system to the point of the definition range that is identified by the measured value. With reference to computation, this means that the case shown in FIG. 5 always occurs.

Figure 5:
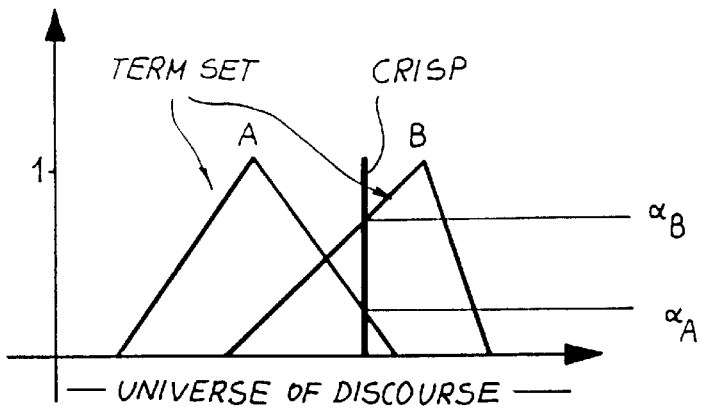
FIG. 5 is an example of fuzzy calculus with crisp values.

Calculation of the weights a in the particular case of FIG. 5, where there are crisp values such as occur in the case of machines that control physical values, becomes merely a matter of finding the intersection αB and αA of the input variables with the membership functions imposed by the term sets A and B.

The weights thus calculated are then used for computation on the consequent of the fuzzy inference (i.e., on the fuzzy rules).

It should be noted that for control systems as in the case of the present invention, the output of the fuzzy regulator must be a definite physical value of the control criterion.

Generally, once the inference has been performed on the right part of the fuzzy rules, a fuzzy set is obtained. It is accordingly necessary to defuzzify, i.e., to extract a definite numeric value from the calculated fuzzy set. There are various defuzzification methods, such as, for example, the centroid method, the maximum height method, etc. In practice, for reasons related to numeric precision, the most widely used method is the centroid method, according to which:

$$y = \frac{\sum_{i=1}^{n} \Omega_i \cdot C_i}{\sum_{1}^{n} \Omega_i}$$

where n is the number of rules and C represents the centroids (centers of gravity) of the membership functions of the consequents of each rule, appropriately modified by using the MAX/MIN or MAX/DOT method. The functions Ω are determined as described earlier, using either the minimum among the functions a or the product thereof. This computational model is referenced as the MAMDANI computational model. As an alternative, it is also possible to use another alternative fuzzy computational model, referenced as SUGENO model, in which defuzzification is performed simply by means of the following rule:

$$y = \sum_{i=1}^{n} \Omega_i \cdot \alpha_i$$

In the above equation, $\Omega_0$ is always equal to 1. In practice, the defuzzified value is determined by a linear combination of the activation values of each individual rule.

Figure 6:
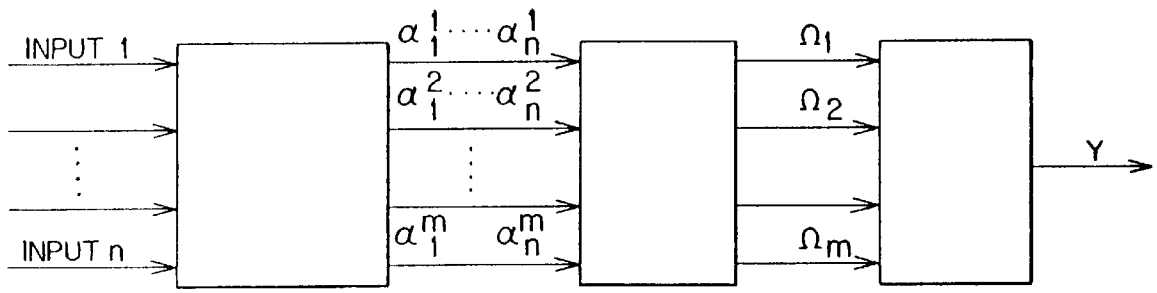
FIG. 6 is an example of a fuzzy computational model.
Figure 7:
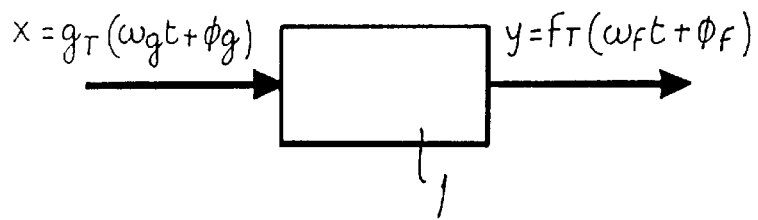
FIG. 7 is a simplified diagram of a known phase-lock circuit.
Figure 8:
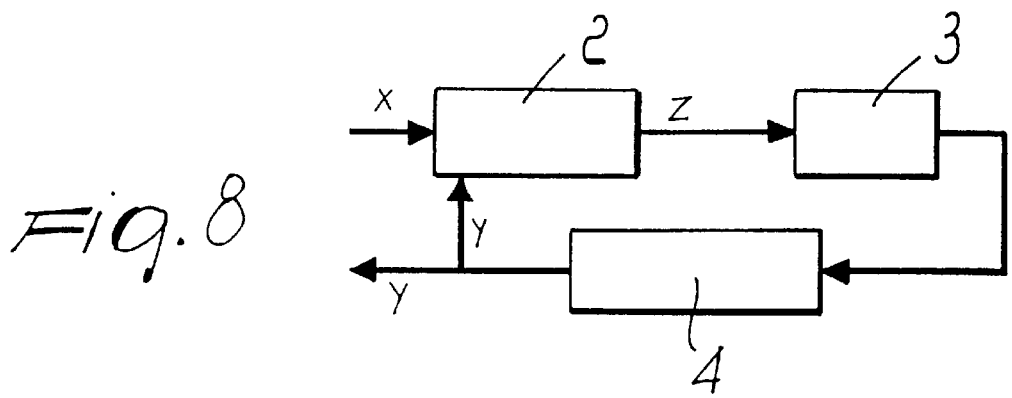
FIG. 8 is a block diagram of a known phase-lock circuit.
Figure 9:
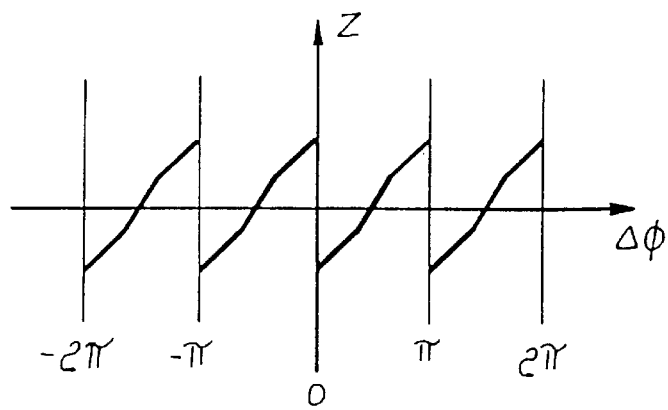
FIG. 9 plots the transfer curve of the phase comparator.

With reference to FIG. 6, in the case of a fuzzy controller, the input values are numeric values (input 1–n) which originate from sensors. In this case it is necessary to fuzzify these values to obtain fuzzy values α, apply the fuzzy inference (the rules) to obtain the weight functions a of said fuzzy values, and finally defuzzify these weight functions Ω so as to obtain a definite numeric value y in output.

Figure 10:
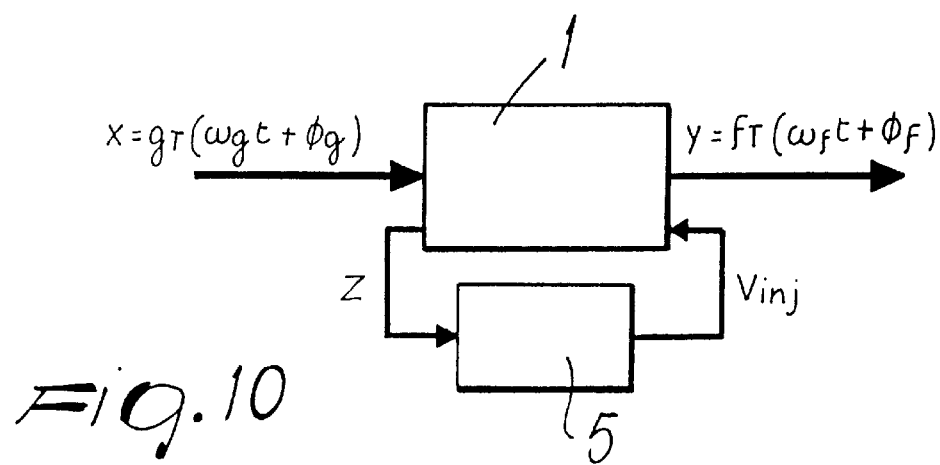
FIG. 10 is a simplified block diagram of the circuit according to the present invention.

The simplified block diagram of the phase-lock loop circuit is shown in FIG. 10. A fuzzy controller 5 is added to the structure of the conventional PLL 1 and receives the phase error z.

The output of the fuzzy controller 5 is a signal which is termed injection signal $V_{inj}$.

Figure 11:
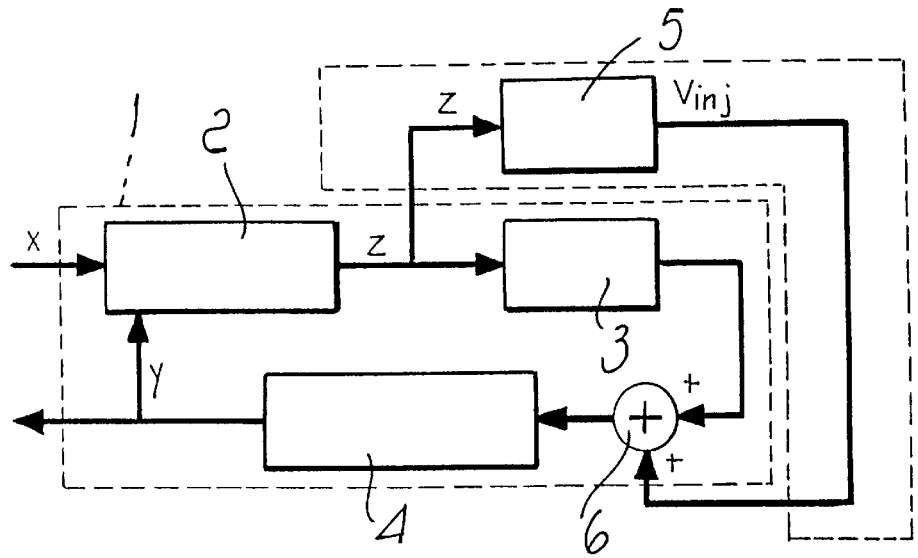
FIG. 11 is a block diagram of the circuit according to the present invention.

The detailed structure of the circuit according to the present invention is shown in FIG. 11. The circuit comprises the conventional elements of a PLL, i.e., the phase comparator 2, the low-pass filter 3, and the voltage-controlled oscillator 4.

The input of the fuzzy controller 5 is connected to the output of the comparator 2, so as to receive as input the phase error signal z. The output of the fuzzy controller 5 is instead connected to an adder node 6 which is interposed between the low-pass filter 3 and the voltage-controlled oscillator 4. In this manner, the output signal of the fuzzy controller 5 is added to the output of the low-pass filter 3.

In this manner, the input of the voltage-controlled oscillator 4 receives a signal that is the sum of the injection voltage generated by the fuzzy controller 5 and of the voltage in output from the low-pass filter 3.

The fuzzy controller 5, by accepting as input the voltage z which is proportional to the phase difference produced by the phase comparator 2, generates an injection signal $V_{inj}$ which is added to the signal that originates from the filter 3. The sum of the two signals drives the voltage-controlled oscillator 4, acting to compensate for large and thus dangerous variations in the phase error z that accordingly tend to cause the unlocking of the PLL.

The fuzzy controller 5, whose relation $V_{inj}$–z is typically nonlinear, acts by using signal processing based on fuzzy rules according to the method described earlier.

Since there is a single input of the fuzzy controller, i.e., the phase error z, and a single output constituted by the injection voltage $V_{inj}$, which is added to the output voltage from the low-pass filter 3, two fuzzy variables are introduced.

Figure 13A:
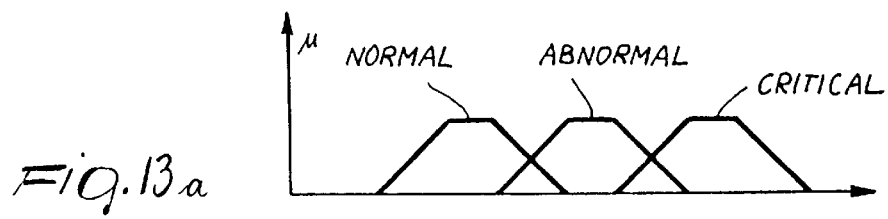
FIG. 13 plots fuzzy membership functions of the circuit according to the present invention.
Figure 13B:
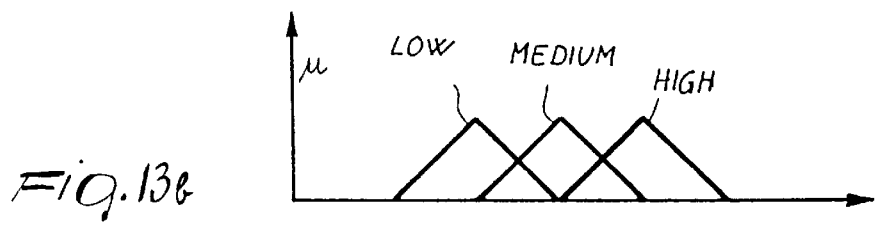

Examples of membership functions are shown in FIG. 13. For the input signal z there are three trapezoidal membership functions: NORMAL, ABNORMAL, and CRITICAL, which represent the various states of the phase difference z.

Three triangular membership functions, LOW, MEDIUM, and HIGH, have instead been developed for the voltage injection signal $V_{inj}$.

Said membership functions are stored in the fuzzification means of the fuzzy controller 5.

A series of fuzzy rules that are characteristic of the 30 behavior of the circuit to be obtained is then developed.

An example of these rules is the following:
rule 1: IF phase error IS NORMAL THEN voltage injection IS LOW
rule 2: IF phase error IS ABNORMAL THEN voltage injection IS MEDIUM
rule 3: IF phase error IS CRITICAL THEN voltage injection IS HIGH These rules are stored in the fuzzy inference unit of the fuzzy controller 5.

The fuzzy inference unit applies to the fuzzy rules, in, the above described manner, the measured values of the phase difference z and the corresponding membership functions so as to obtain a consequent of the fuzzy rules.

The weights $\Omega$ of the antecedents are calculated, in the above described manner, by a weight calculation unit of the fuzzy controller 5.

Defuzzification means of the fuzzy controller 5 extract crisp values of the voltage injection signal $V_{inj}$ on the basis of the calculated weights $\Omega$ and of the results of the rules.

The defuzzification method can be any one among those described earlier (MAX/MIN, MAX/DOT).

The crisp values can be calculated by means of the centroid method described earlier.

The circuit executed according to the present invention considerably improves the lock-in range $\Delta w_L$. Practical tests that have been conducted have furthermore demonstrated that locking times are shorter than those of the conventional structure described earlier.

In order to better understand the operating principle of the new structure, reference should be made to FIG. 12, which plots the frequency spectra of a conventional PLL and of a PLL according to the present invention.

Figures 12A, 12B, 12C:
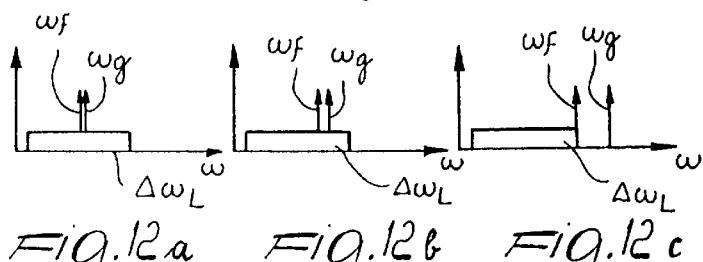
FIGS. 12*a*—12*f* plot comparisons of frequency spectra of a known phase-lock circuit and of the circuit according to the present invention.
Figures 12D, 12E, 12F:
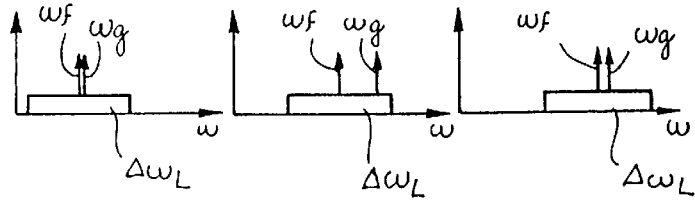

FIGS. 12a, 12b, and 12c are related to a conventional PLL structure, whereas FIGS. 12d, 12e, and 12f relate to the circuit according to the present invention.

While the locking situations shown in FIGS. 12a and 12b coincide in both cases, since they indeed correspond to the optimum locking situation, it is evident in FIG. 12e that a change in the input frequency $w_g$ entails a shift of the lock-in range $\Delta w_L$ in the case of the circuit according to the present invention. This occurs because the input frequency is kept within the lock-in range. This does not occur in a conventional PLL, where the lock-in range remains anchored to the original position, as shown in FIG. 12b.

The substantial improvement becomes evident by comparing FIGS. 12c and 12f. In the case of FIG. 12c, the input frequency $w_g$ is outside the lock-in range $\Delta w_L$. Accordingly, the subsequent locking occurs (if it can) with cycle skips and in a relatively long time. In the case of FIG. 12f, by using the circuit according to the present invention locking occurs every time and very quickly, since the input frequency lies always within the proposed lock-in range.

The present invention accordingly fully achieves the intended aim and objects.

The circuit according to the present invention is able to produce a considerable increase in the lock-in range, particularly at very high values, with respect to a conventional PLL.

The introduction of fuzzy logic allows not only easy hardware implementation of the control surface, but also the possibility to optimize the control according to the type of phase comparator that is used. This structure is furthermore equally effective even in the presence of noise.

Easy implementation is linked to the consideration that the provision of nonlinear curves, suitable to produce specific control surfaces, incurs in the difficulty of implementing desired curves. This occurs because if said curves are obtained with analog methods it is difficult to find components that perform the desired function over a sufficiently wide range. If instead the digital approach is used, one encounters the circuital complexity in the necessary A/D and D/A conversion and the consequent reduction in intervention speed, which might be insufficient for the very fast applications in which most PLLs must operate (telecommunications). These problems are avoided with the circuit and the related fuzzy control according to the present invention.

The invention thus conceived is susceptible of numerous modifications and variations, all of which are within the scope of the inventive concept.

Finally, all the details may be replaced with other technically equivalent ones.

In practice, the materials employed, as well as the shapes and dimensions, may be any according to the requirements without thereby abandoning the protective scope of the appended claims.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is: wherein the adjusting circuit includes a fuzzy logic controller.

1. A phase-lock circuit with fuzzy control, comprising:
   a phase comparator that receives first and second input signals, the first input signal being an input signal to the phase-locked loop, and that provides a phase difference signal that represents a difference in phase between the first and second input signals;
   a low-pass filter, coupled to the output of the phase comparator, to provide a filtered signal;
   a voltage-controlled oscillator, having an input that receives the filtered signal and having an output that provides the second input signal; and
   fuzzy control means, coupled to the phase comparator to receive the phase difference signal, to provide a fuzzy control output signal that is coupled to the input of the voltage-controlled oscillator to further drive the voltage-controlled oscillator.

2. The circuit according to claim 1, further comprising an adder circuit coupled between said low-pass filter and said voltage-controlled oscillator, said adder circuit being suitable to add the fuzzy control output signal and the filtered signal to provide a combined signal that is coupled to the input of the voltage-controlled oscillator.

3. The circuit according to claim 1, wherein said fuzzy control means includes fuzzification means for generating membership functions for said phase difference signal.

4. The circuit according to claim 1, wherein said fuzzy control means includes fuzzification means for generating membership functions and for providing the fuzzy control output signal.

5. The circuit according to claim 4, wherein said fuzzy control means further includes fuzzy inference means for storing fuzzy inference rules and for applying said fuzzy inference rules to said membership functions and to said phase difference signal to generate inference values.

6. The circuit according to claim 5, wherein said fuzzy control means further includes defuzzification means for extracting real values from the inference values to generate the fuzzy control output signal.

7. A method for controlling a phase-locked loop circuit which includes a phase comparator, a low-pass filter, and a voltage-controlled oscillator, said phase comparator being capable of generating a phase difference signal that represents a phase difference between an input signal and a signal generated by said voltage-controlled oscillator, said low-pass filter receiving said phase difference signal as input and providing a first control signal as output to drive said voltage-controlled oscillator, the method comprising the steps of:

measuring said phase difference signal; and applying fuzzy control to said phase difference signal to generate a second control signal;

adding said second control signal to said first control signal to drive said voltage-controlled oscillator.

8. The method according to claim 7, wherein said step of applying includes a step of generating at least one membership function for said phase difference signal and for said second control signal.

9. The method according to claim 8, wherein said step of applying further includes a step of applying fuzzy inference rules to said phase difference signal and to said at least one membership function to provide at least one inference signal.

10. The method according to claim 9, wherein said step of applying further includes a step of applying a defuzzification step to extract real values of said second control signal from the at least one inference signal.

11. A phase-locked loop, comprising:

a phase comparator receiving first and second input signals and having an output providing a phase difference signal indicative of a difference in phase between the first input signal and the second input signal;

a filter having an input coupled to the output of the phase comparator to receive the phase difference signal and an output that provides a filtered phase difference signal;

a fuzzy logic controller, having an input coupled to the output of the phase comparator to receive the phase difference signal, and an output that provides an injection signal;

a summing circuit receiving the injection signal and the filtered phase difference signal to generate a control signal; and an oscillator, receiving the control signal, to provide an output signal of the phase-locked loop, the output signal of the phase-locked loop providing the second input signal of the phase comparator.

12. The phase-locked loop of claim 11, wherein the fuzzy logic controller includes a sensor, coupled to the input of the fuzzy controller, to generate an input proposition signal that represents the phase difference signal.

13. The phase-locked loop of claim 12, further including at least one fuzzification module, coupled to the sensor to receive the input proposition signal, performing at least one fuzzy logic operation on the input proposition signal to generate a weight signal.

14. The phase-locked loop of claim 13, further including a defuzzification module that receives the weight signal and extracts a definite numerical value from the weight signal to generate the injection signal.

15. The phase-locked loop of claim 12, wherein the at least one fuzzification module includes two fuzzification modules, a first fuzzification module coupled to the sensor to receive the input proposition signal, that applies a first weight function to the input proposition signal to generate a matching signal indicative of a degree to which the input proposition signal matches at least one stored premise; and a second fuzzification module, coupled to the first fuzzification module to receive the matching signal, that applies a second weight function to the matching signal to generate a general resemblance signal.

16. A phase-locked loop having a lock-in range, comprising:

a phase comparator having first and second inputs respectively receiving an input signal and a feedback signal, and an output that provides a phase difference signal indicative of a difference in phase between the input signal and the feedback signal;

an oscillator having an input coupled to the output of the phase comparator and an output that provides the feedback signal, the feedback signal being provided at a frequency that varies in response to the phase difference signal; and an adjusting circuit, coupled to the phase comparator and the oscillator, that provides an adjustment signal to the oscillator to adjust the lock-in range of the phase-locked loop in response to a magnitude of the phase difference signal wherein the adjusting circuit includes a fuzzy logic controller.

17. The phase-locked loop of claim 16, wherein the fuzzy logic controller includes a sensor, coupled to the input of the fuzzy controller, to generate an input proposition signal that represents the phase difference signal.

18. The phase-locked loop of claim 17, wherein the fuzzy logic controller further includes at least one fuzzification module, coupled to the sensor to receive the input proposition signal, that performs at least one fuzzy logic operation on the input proposition signal to generate a weight signal.

19. The phase-locked loop of claim 18, wherein the fuzzy logic controller further includes a defuzzification module that receives the weight signal and extracts a definite numerical value from the weight signal to generate the injection signal.

20. The phase-locked loop of claim 18, wherein the at least one fuzzification module includes two fuzzification modules, a first fuzzification module coupled to the sensor to receive the input proposition signal, that applies a first weight function to the input proposition signal to generate a matching signal indicative of a degree to which the input proposition signal matches at least one stored premise; and a second fuzzification module, coupled to the first fuzzification module to receive the matching signal, that applies a second weight function to the matching signal to generate a general resemblance signal.

21. A phase-locked loop, comprising:

a phase comparator having first and second inputs respectively receiving an input signal and a feedback signal, and an output that provides a phase difference signal indicative of a difference in phase between the input signal and the feedback signal;

an oscillator, having an input coupled to the output of the phase comparator and an output that provides the feedback signal, the feedback signal being provided at a frequency that varies in response to the phase difference signal; and fuzzy logic means for adjusting the input of the voltage-controlled oscillator so that a lock-in range of frequencies of the phase-locked loop tracks changes in the frequency of the of the input signal.

22. The phase-locked loop of claim 21, wherein the fuzzy logic means includes sensing means for sensing the phase difference signal to generate an input proposition signal that represents the phase difference signal.

23. The phase-locked loop of claim 22, wherein the fuzzy logic means further includes fuzzification means, coupled to the sensing means to receive the input proposition signal, for performing at least one fuzzy logic operation on the input proposition signal to generate a weight signal.

24. The phase-locked loop of claim 23, wherein the fuzzy logic means further includes defuzzification means for extracting a definite numerical value from the weight signal to generate the injection signal.

25. The phase-locked loop of claim 23, wherein the fuzzification means includes:

first fuzzification means, coupled to the sensing means to receive the input proposition signal, for applying a first weight function to the input proposition signal to generate a matching signal indicative of a degree to which the input proposition signal matches at least one stored premise; and second fuzzification means, coupled to the first fuzzification means to receive the matching signal, for applying a second weight function to the matching signal to generate a general resemblance signal.

26. A method of extending a lock-in range of a phase-locked loop, comprising the steps of:

A. monitoring an output signal of a phase comparator of the phase-locked loop;

B. generating an adjustment signal whose value varies in response to the monitored output signal of the phase comparator; and C. providing the adjustment signal to an input of an oscillator of the phase-locked loop to move the lock-in range wherein the step of generating the adjustment signal includes a step of applying at least one fuzzy logic operation to the output signal to generated the adjustment signal.

27. The phase-locked loop of claim 26, wherein the step of applying at least one fuzzy logic operation includes a step of generating an input proposition signal that represents the output signal of the phase comparator.

28. The phase-locked loop of claim 26, wherein the step of applying at least one fuzzy logic operation further includes a step of performing at least one fuzzy logic operation on the input proposition signal to generate a weight signal.

29. The phase-locked loop of claim 28, wherein the step of applying at least one fuzzy logic operation further includes a step of extracting a definite numerical value from the weight signal to generate the adjustment signal.

30. A method for locking an output signal having an output phase to an input signal having an input phase, comprising the steps of:

A. comparing the output phase to the input phase;

B. performing at least one fuzzy inference to generate an adjusting signal based on the comparison of the input and output phases; and C. generating the output signal based upon the phase comparison of the input and output phases and on the adjusting signal.

31. The method of claim 30, wherein step A includes generating a phase difference signal that varies according to a difference in phase between the input phase and the output phase.

32. The method of claim 31, wherein step C includes a step of combining the phase difference signal and the adjusting signal to provide a combination signal.

33. The method of claim 31, wherein the step of combining includes a step of adding the phase difference signal to the adjusting signal to provide the combination signal.

34. The method of claim 32, wherein step C further includes a step of varying a frequency of the output signal in response to variations in the combination signal.

35. The method of claim 30, wherein step C includes a step of varying a frequency of the output signal based on variations in the adjusting signal.

* * * * *

UNITED STATES PATENT AND TRADEMARK OFFICE
CERTIFICATE OF CORRECTION

PATENT NO. : 5,805,649

DATED : September 8, 1998

INVENTOR(S): Federico Travaglia, Maria Grazia La Rosa and Guido Giarrizzo

It is certified that error appears in the above-identified patent and that said Letters Patent is hereby corrected as shown below:

On the title page, item [75] should read:

[75] Inventors: Federico Travaglia, Milan; Maria Grazia La Rosa, Catania; Guido Giarrizzo, Catania, all of Italy Signed and Sealed this Eighth Day of December, 1998

Attest:

BRUCE LEHMAN

Attesting Officer

Commissioner of Patents and Trademarks